United States Patent
Lu et al.

(10) Patent No.: US 6,960,254 B2
(45) Date of Patent: Nov. 1, 2005

(54) METHOD TO MONITOR AND CONTROL THE CRYSTAL COOLING OR QUENCHING RATE BY MEASURING CRYSTAL SURFACE TEMPERATURE

(75) Inventors: Zheng Lu, St. Charles, MO (US); Steven L. Kimbel, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 125 days.

(21) Appl. No.: 10/623,967

(22) Filed: Jul. 21, 2003

(65) Prior Publication Data

US 2005/0016443 A1    Jan. 27, 2005

(51) Int. Cl.[7] ............................................. C30B 15/20
(52) U.S. Cl. .......................... 117/14; 117/13; 117/15; 117/201; 117/202; 117/208
(58) Field of Search ............................... 117/13, 14, 15, 117/201, 202, 208

(56) References Cited

U.S. PATENT DOCUMENTS

| | | |
|---|---|---|
| 5,178,720 A | 1/1993 | Frederick |
| 5,653,799 A | 8/1997 | Fuerhoff |
| 5,665,159 A | 9/1997 | Fuerhoff |
| 5,846,318 A | 12/1998 | Javidi |
| 5,882,402 A | 3/1999 | Fuerhoff |
| 6,503,322 B1 | 1/2003 | Schrenker et al. |
| 6,599,815 B1 * | 7/2003 | Yang .......................... 438/471 |

* cited by examiner

Primary Examiner—Felisa Hiteshew
(74) Attorney, Agent, or Firm—Senniger Powers (57) ABSTRACT

A method and apparatus for controlling the quenching rate of a monocrystalline ingot pulled from a melt by adjusting one or more post growth processing parameter. A temperature model generates a temperature profile that represents the surface temperature along the length of the ingot at the instant it is pulled from the melt. A first temperature at a particular location along the length of the crystal is determined from the temperature profile. A temperature sensor senses a second temperature at the same particular location. A PLC calculates a quenching rate of the crystal as a function of the first temperature and the second temperature. The PLC generates an error between a target quenching rate and a calculated quenching rate, and one or more post growth process parameters are adjusted as function of the error signal to optimize the quenching rate. Alternatively, temperature readings from the sensor are collected and the quenching rates of the crystal are calculated after crystal growth and post growth quenching. One or more post growth process parameters are modified and programmed for subsequent crystal growth and post growth quenching to achieve optimized quenching rate and crystal quality.

23 Claims, 9 Drawing Sheets

METHOD TO MONITOR AND CONTROL THE CRYSTAL COOLING OR QUENCHING RATE BY MEASURING CRYSTAL SURFACE TEMPERATURE

BACKGROUND OF THE INVENTION

The present invention relates generally to crystal growing apparatus used in growing monocrystalline silicon ingots, and more particularly to a control assembly for use in such a crystal growing apparatus. Single crystal silicon, which is the starting material for most semiconductor electronic component fabrication, is commonly prepared by the so-called Czochralski ("Cz") method. Conventional growth of the crystal is most commonly carried out in a crystal pulling furnace. In this method, polycrystalline silicon ("polysilicon") is charged to a crucible and melted by a heater surrounding the outer surface of the crucible side wall. A seed crystal is brought into contact with the molten silicon and a single crystal ingot is grown by relatively slow extraction via a crystal puller. After formation of a neck is complete, the diameter of the crystal ingot is enlarged by decreasing the pulling rate and/or the melt temperature until the desired or target diameter is reached. The cylindrical main body of the crystal, which preferably has an approximately constant diameter, is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

It is now recognized that a number of defects in single crystal silicon form in the growth chamber as the post growth ingot cools from the temperature of solidification. More specifically, intrinsic point defects, such as crystal lattice vacancies or silicon self-interstitials, remain soluble in the silicon lattice while the temperature of the ingot remains above a threshold temperature. After the ingot cools below the threshold temperature, the given concentration of intrinsic point defects becomes critically supersaturated. Upon cooling to below this threshold temperature, a reaction or agglomeration event occurs, resulting in the formation of agglomerated intrinsic point defects, which can produces other defects such as edge slips.

The type and initial concentration of these point defects in the silicon are determined as the ingot cools from the temperature of solidification (i.e., about 1410° C.) to a temperature greater than about 1300° C.; that is, the type and initial concentration of these defects are controlled by the ratio $v/G_0$, where v is the growth velocity and $G_0$ is the average axial temperature gradient over this temperature range. Accordingly, process conditions, such as growth rate (which affect v), as well as hot zone configurations (which affect $G_0$), can be controlled to determine whether the intrinsic point defects within the single crystal silicon will be predominantly vacancies (where $v/G_0$ is generally greater than the critical value) or self-interstitials (where $v/G_0$ is generally less than the critical value).

Defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography).

Defects which act as the nuclei for the formation of oxidation induced stacking faults (OISF), are also present in regions of excess vacancies, or regions where some concentration of free vacancies are present but where agglomeration has not occurred. It is speculated that this particular defect, generally formed proximate the boundary between interstitial and vacancy (V/I boundary) dominated material, is a high temperature nucleated oxygen precipitate catalyzed by the presence of excess vacancies; that is, it is speculated that this defect results from an interaction between oxygen and "free" vacancies in a region near the V/I boundary.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

Agglomerated defect formation generally occurs in two steps. First, defect "nucleation" occurs, which is the result of the intrinsic point defects being supersaturated at a given temperature. Once this "nucleation threshold" temperature is reached, intrinsic point defects agglomerate. The intrinsic point defects will continue to diffuse through the silicon lattice as long as the temperature of the portion of the ingot in which they are present remains above a second threshold temperature (i.e., a "diffusivity threshold"). Below the second threshold temperature, intrinsic point defects are no longer mobile within commercially practical periods of time. While the ingot remains above this temperature, vacancy or interstitial intrinsic point defects diffuse through the crystal lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Accordingly, the formation and size of agglomerated defects are dependent upon the growth conditions, including $v/G_0$ (which impacts the initial concentration of such point defects), as well as the cooling rate or residence time of the main body of the ingot over the range of temperatures bound by the "nucleation threshold" at the upper end and the "diffusivity threshold" (which impacts the size and density of such defects) at the lower end. Thus, control of the cooling rate or residence time enables the formation of agglomerated intrinsic point defects to be suppressed over much larger ranges of values for $v/G_0$; that is, controlled cooling allows for a much larger "window" of acceptable $v/G_0$ values to be employed while still enabling the growth of substantially defect-free silicon. Reducing the quenching rate too severely can compromise process robustness in production. For example, production yield loss has been identified to be caused by insufficient cooling.

Under certain thermal conditions (for example, those present when "quench" cooling is employed), slip dislocations are known to form at the lateral or radial edge of the ingot. Slip dislocations can also occur at locations radially inward of the edge in a region (when present) wherein vacancies are the predominant intrinsic point defect. Without being held to any particular theory, it generally believed that the formation of such dislocations are, at least in part, due to thermal stress which occurs in the ingot as it cools from the solidification temperature. Edge slip dislocations typically form and propagate along the <110> interface between <111> planes. It is believed these form as a result of a radial temperature gradient that is too large; that is, an outer region of the ingot, proximate the radial edge, cools much faster than an inner region of the ingot. In such instances, silicon in this outer region contacts around the hotter, and thus expanded, inner region. This contractions generates internal stress, both tensile stress (at or near the surface of the ingot) and compressive stress (at or near the center of the ingot). In the case of edge slip, tensile stress dominates. If this stress is above the critical resolve shear stress at a given temperature (critical resolve shear stress being a function of temperature), a slip dislocation at or proximate the edge occurs. Although the axial temperature gradient can be a factor, experience to-date suggests edge slip dislocations are primarily a function of the radial gradient of a given segment of the ingot upon entry and/or exist of an upper heater.

As an example, one crystal puller used for controlling the cooling of monocrystalline ingots above the nucleation threshold of intrinsic point defects includes an electrical resistance heater mounted in the pull chamber of the crystal puller housing generally toward the bottom of the pull chamber of the housing. The electrical resistance heater has heating segments that may be constructed of equal length (e.g., a non-profiled heater) or of stepped, or staggered lengths (e.g., a profiled heater). As portions of the ingot grown in the puller are pulled upward into radial registration with the heater, heat is radiated by the heater to these portions of the ingot to reduce the cooling rate of the ingot. Commonly assigned U.S. Pat. No. 6,503,322, the entire disclosure of which is incorporated herein by reference, describes an electrical resistance heater for use in a crystal puller to facilitate reduction of agglomeration of intrinsic point defects.

Commonly assigned U.S. patent application Ser. No. 09/661,745, the entire disclosure of which is incorporated herein by reference, discloses a quenching process for growing a monocrystalline silicon ingot according to the Czochralski method in which the nucleation and/or growth of interstitial type defects is suppressed by controlling the cooling rate of the ingot through nucleation. For example, initial growth conditions may be selected to provide an ingot containing silicon self-interstitials as the predominant intrinsic point defect from the center to the edge of the ingot, or a central core in which vacancies are the predominant intrinsic point defect surrounded by an axially symmetric region in which silicon self-interstitials are the predominant intrinsic point defect. As the ingot cools while being pulled upward within the crystal puller, the temperature of the ingot is maintained above the temperature range at which nucleation of the self-interstitials occurs, such as about 850° C.–950° C., for a time period sufficient for adequate diffusion of intrinsic point defects. Then, the ingot is rapidly cooled, or quenched, through the nucleation temperature range to inhibit nucleation. Below the nucleation temperature range, no further nucleation will occur. The process is disclosed as producing ingots that are substantially free of intrinsic point defects.

Other methods for controlling the cooling rate of a post growth ingot include pulling the ingot away from the melt and upward within the crystal puller at pre-programmed pull out rates. However, pulling the post growth ingot according to a predetermined fixed rate does not allow adjustments for temperature variations, which frequently occur during post growth cooling stages in almost all of the crystal processes.

While the crystal puller configurations discussed above are effective for increasing the dwell time of the ingot above a desired temperature, further improvements are desired for carrying out the quenching process described above to produce ingots that are substantially free of intrinsic point defects and edge slips. In particular, improvements are desired for adjusting post-growth process parameters in response to actual cooling rates captured during processing.

SUMMARY OF THE INVENTION

Among the several objects and features of the present invention may be noted the provision of a crystal puller and method for growing an ingot according to the Czhochralski method which facilitates the growth of ingots that are substantially free of agglomerated intrinsic point defects; the provision of a system for monitoring the thermal history of a ingot during or post growth; the provision of a system which adjusts post growth processing parameters in response to an actual cooling rate of the ingot to achieve an optimum quenching rate without generating edge slips.

In accordance with one aspect of the invention, a method is provided for use with a crystal growing apparatus for optimizing a cooling rate of a monocrystalline ingot grown according to the Czochralski process. The crystal growing apparatus has a heated crucible containing a semiconductor melt from which the ingot is grown. The ingot is grown on a seed crystal pulled from the melt. The crystal growing apparatus also has includes a receiving chamber into which the ingot is pulled, and the ingot is pulled along a generally longitudinal path toward the receiving chamber. The method includes determining a first temperature of the ingot when the ingot is at a first position along the path and determining a second temperature of the ingot when the ingot is at a second position along the path. A distance D along the path separates the first and second positions. The method also includes determining a cooling rate of the ingot as a function of a difference between the first temperature and the second temperature relative to an amount of time for pulling the ingot the distance D. By generating a signal representative of an error between a target cooling rate of the ingot and the determined cooling rate of the ingot, the method adjusts one or more post-growth processing parameters as a function of the error signal thereby to control the cooling rate of the ingot.

In accordance with another aspect of the invention, a method is provided for use with a crystal growing apparatus for optimizing a cooling rate of a monocrystalline ingot grown according to the Czochralski process. The crystal growing apparatus has a heated crucible containing a semiconductor melt from which the ingot is grown. The ingot is grown on a seed crystal pulled from the melt. The crystal growing apparatus also has a receiving chamber into which the ingot is pulled, and the ingot is pulled along a generally longitudinal path toward the receiving chamber. The method includes measuring a temperature of the ingot at a location along the length of the ingot at a position along the path, and generating a signal representative of an error between a target temperature of the ingot when it is at the position along the path and the measured temperature of the ingot. The method further includes adjusting one or more post growth processing parameters as a function of the error signal thereby to control to cooling rate of the ingot.

Yet another aspect of the invention is directed to an apparatus for use with a crystal growing apparatus for optimizing a cooling rate of a monocrystalline ingot grown according to the Czochralski process. The crystal growing apparatus has a heated crucible containing a semiconductor melt from which the ingot is grown. The ingot is grown on a seed crystal pulled from the melt. The crystal growing apparatus also has a receiving chamber into which the ingot is pulled, and the ingot is pulled along a generally longitudinal path toward the receiving chamber. The apparatus includes a first temperature sensor positioned along the path of the ingot for measuring a first temperature of the ingot surface at a location along the length of the ingot when the ingot is at a first position along the path. The apparatus further includes a second temperature sensor positioned along the path of the ingot for measuring a second temperature of the ingot surface at the same location along the length of the ingot when the ingot is at a second position along the path. A distance D separates the first and second positions. A controller generates an error signal representative of an error between a target cooling rate of the ingot and a calculated cooling rate of the ingot. The calculated cooling rate is calculated as a function of a difference between the first temperature and the second temperature relative to an amount of time for pulling the ingot the distance D. The apparatus further includes a processing component responsive to the error signal for adjusting a processing parameter set point as a function of the error signal to control the cooling rate of the ingot.

Another apparatus embodying aspects of the invention is provided for use with a crystal growing apparatus for optimizing a cooling rate of a monocrystalline ingot grown according to the Czochralski process. The crystal growing apparatus has a heated crucible containing a semiconductor melt from which the ingot is grown. The ingot is grown on a seed crystal pulled from the melt. The crystal growing apparatus also has a receiving chamber into which the ingot is pulled, and the ingot is pulled along a generally longitudinal path toward the receiving chamber. The apparatus includes a temperature sensor positioned along the path of the ingot for measuring a temperature of the ingot surface at a location along the length of the ingot when the ingot is at a position along the path. The apparatus further includes a controller for generating an error signal representative of an error between a target temperature of the ingot when it is at the position along the path and the measured temperature of the ingot. A processing component responsive to error signal adjusts a processing parameter set point as a function of the error signal to control the cooling rate of the ingot.

Alternatively, the invention may comprise various other methods and apparatuses.

Other features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE INVENTION

Figure 1:
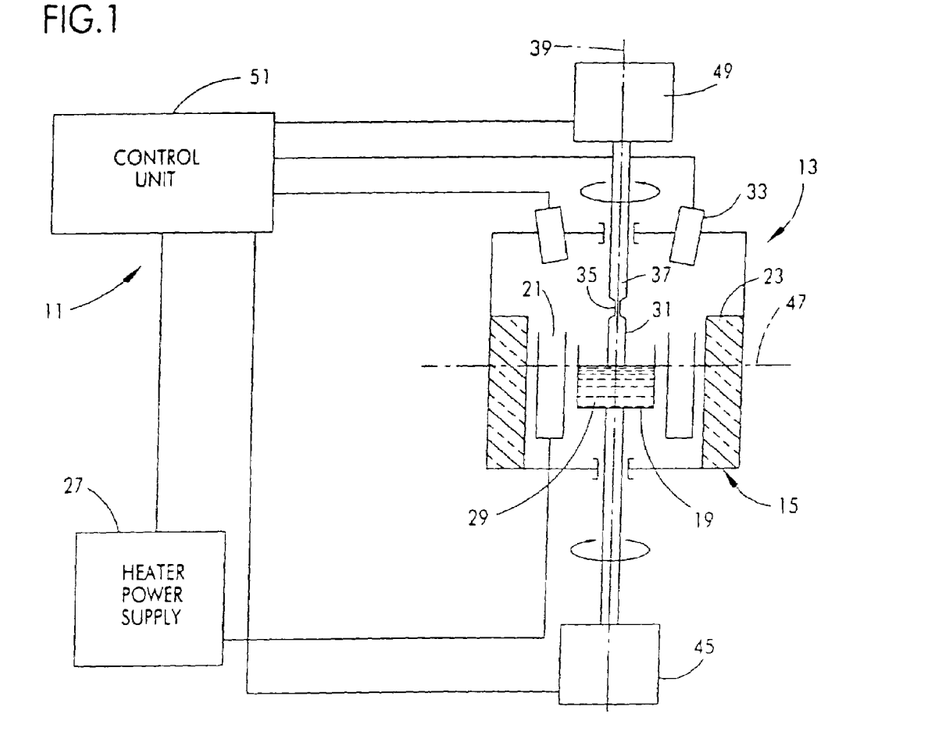
FIG. 1 is an illustration of a crystal growing apparatus and an apparatus according to the present invention for controlling the crystal growing apparatus.

Referring now to FIG. 1, a system, indicated generally at 11, is shown for use with a Czochralski crystal growing apparatus, indicated generally at 13. The details of construction of the crystal growing apparatus 13 are well known to those of ordinary skill in the art. In general, crystal growing apparatus 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. A vacuum pump (not shown) typically removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. Preferably, a temperature sensor 33, such as a photo cell or pyrometer, is to be used to provide measurements of the melt surface temperature. The single crystal 31 starts with a seed crystal 35 attached to a pull shaft, or cable, 37. As shown in FIG. 1, single crystal 31 and crucible 19 generally have a common axis of symmetry 39. One end of cable 37 is connected by way of a pulley 41 (see FIG. 4) to a drum 43 (see FIG. 4) and the other end is connected to a chuck (not shown) that holds the seed crystal 35 and the crystal 31 grown from the seed crystal.

During both heating and crystal pulling, a crucible drive unit 45 rotates crucible 19 (e.g., in the clockwise direction). The crucible drive unit 45 also raises and lowers crucible 19 as desired during the growth process. For example, crucible drive unit 45 raises crucible 19 as the melt 29 is depleted to maintain its level, indicated by reference character 47, at a desired height. A crystal drive unit 49 similarly rotates the cable 37 in a direction opposite the direction in which crucible drive unit 45 rotates crucible 19. In addition, the crystal drive unit 49 raises and lowers crystal 31 relative to the melt level 47 as desired during the growth process.

In one embodiment, crystal growth apparatus 13 preheats the seed crystal 35 by lowering it nearly into contact with the molten silicon of melt 29 contained by crucible 19. After preheating, crystal drive unit 49 continues to lower seed crystal 35 via cable 37 into contact with melt 29 at its melt level 47. As seed crystal 35 melts, crystal drive unit 49 slowly withdraws, or pulls, it from the melt 29. Seed crystal 35 draws silicon from melt 29 to produce a growth of silicon single crystal 31 as it is withdrawn. Crystal drive unit 49 rotates crystal 31 at a reference rate as it pulls crystal 31 from melt 29. Crucible drive unit 45 similarly rotates crucible 19 at another reference rate, but usually in the opposite direction relative to crystal 31.

A control unit 51 of FIG. 1 initially controls the withdrawal rate and the power that power supply 27 provides to heater 21 to cause a neck down of crystal 31. Preferably, crystal growth apparatus 13 grows the crystal neck at a substantially constant diameter as seed crystal 35 is drawn from melt 29. For example, the control unit 51 maintains a substantially constant neck diameter of about five percent of the desired body diameter. After the neck reaches a desired length, control unit 51 then adjusts the rotation, pull, and/or heating parameters to cause the diameter of crystal 31 to increase in a cone-shaped manner until a desired crystal body diameter is reached. For example, the control unit 51 decreases the pull rate to create an outwardly flaring region typically referred to as the taper of the crystal. Once the desired crystal diameter is reached, control unit 51 controls the growth parameters to maintain a relatively constant diameter as measured by apparatus 11 until the process approaches its end. At that point, the pull rate and heating are usually increased for decreasing the diameter to form a tapered portion at the end of single crystal 31.

Commonly assigned U.S. Pat. No. 5,178,720, the entire disclosure of which is incorporated herein by reference, discloses one preferred method for controlling crystal and crucible rotation rates as a function of the crystal diameter. Commonly assigned U.S. Pat. Nos. 5,882,402, 5,846,318, 5,665,159 and 5,653,799, the entire disclosures of which are incorporated herein by reference, provide accurate and reliable measurements of a number of crystal growth parameters, including crystal diameter. In these patents, an image processor processes images of the crystal-melt interface to determine the diameter. When the diameter becomes small enough, the crystal 31 is then separated from the melt 29.

Figure 2A:
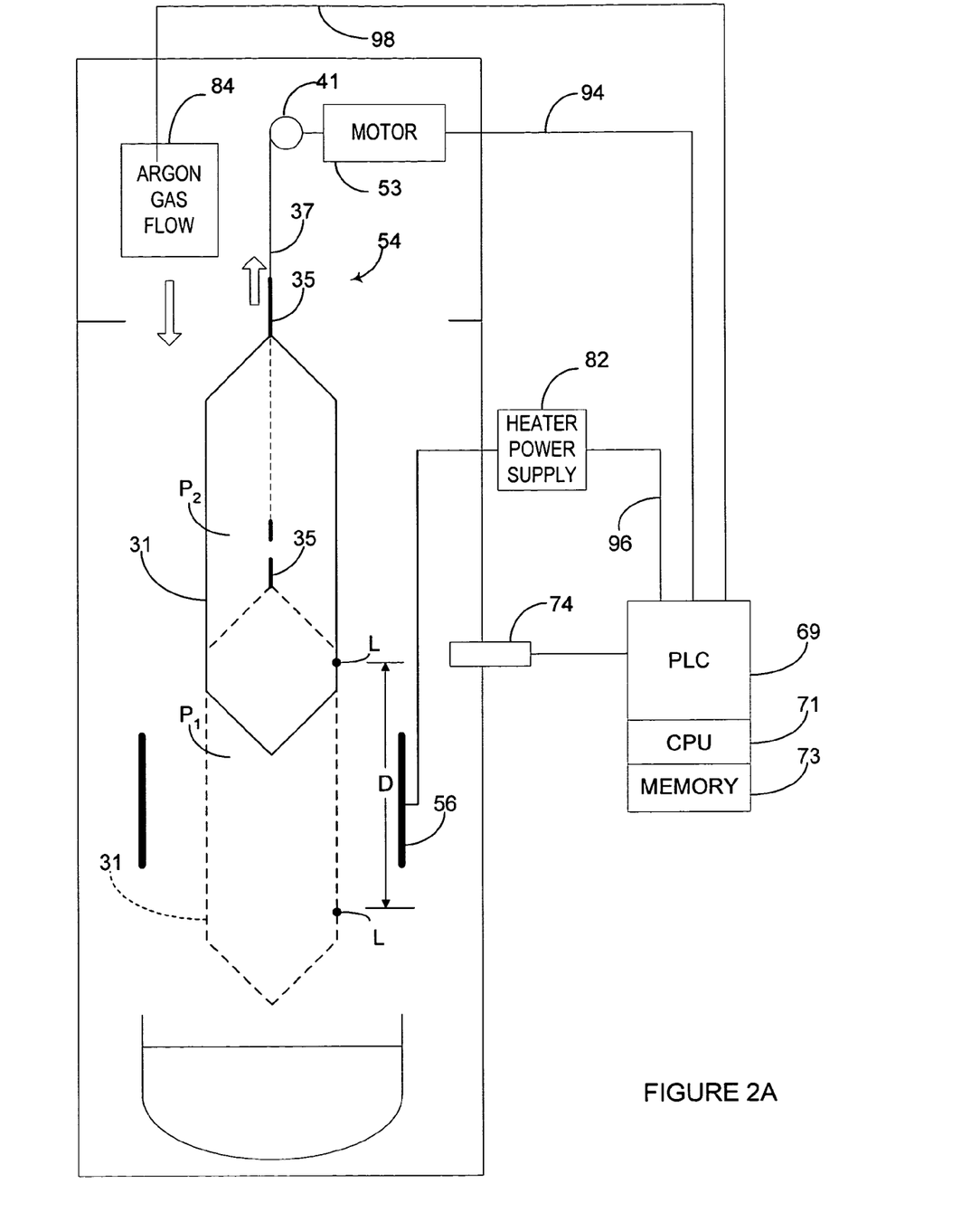
FIGS. 2A and 2B are block diagrams illustrating components of a crystal growing apparatus for controlling the quenching rate of a crystal according to exemplary embodiments of the invention.
Figure 2B:
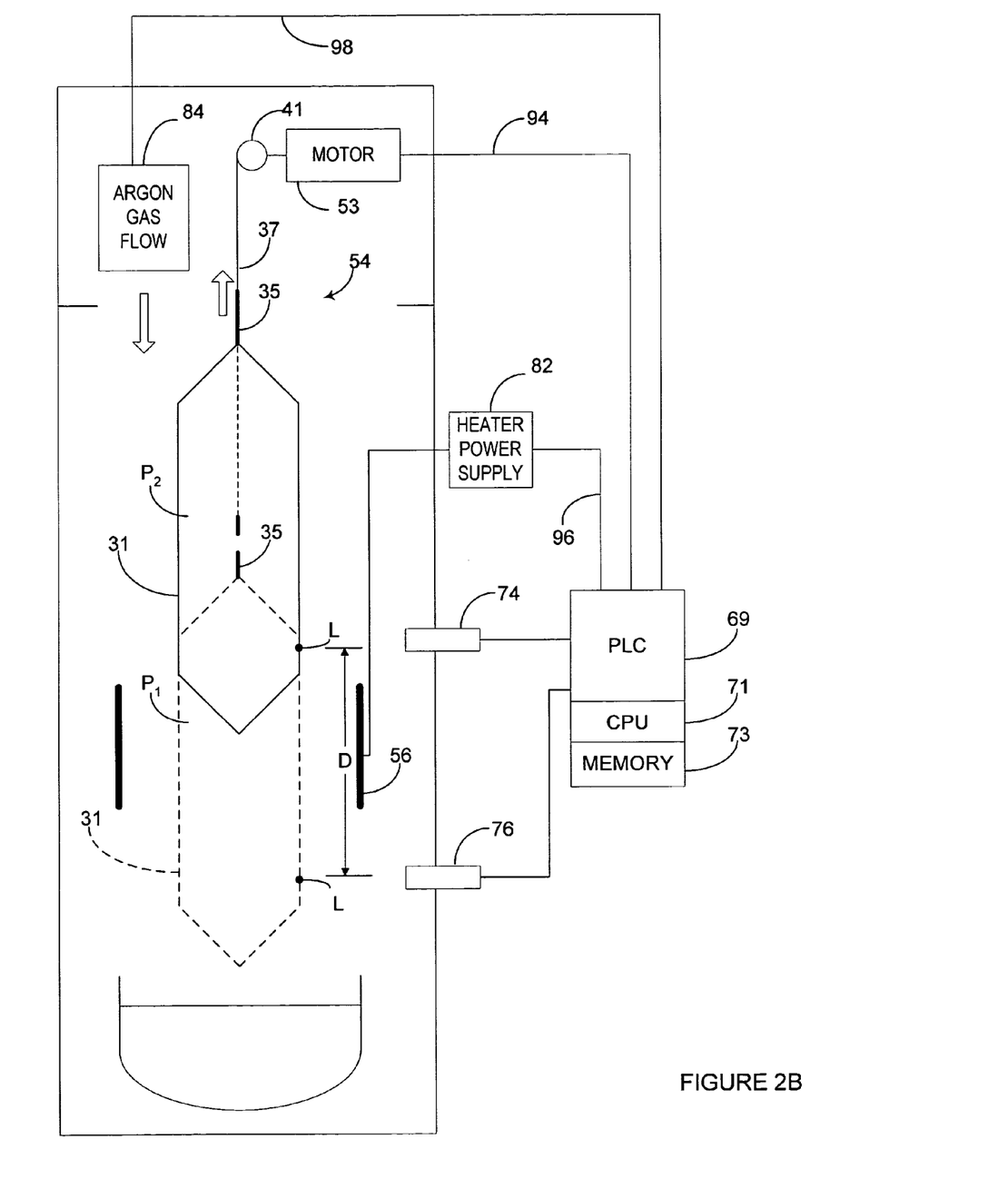

Referring now to FIGS. 2A and 2B, after the ingot (i.e., post growth crystal 31) is separated from the melt, it is pulled upward within the crystal puller 13. It is to be understood that in FIGS. 2A and 2B, the details of the upper part of the crystal puller, which includes upper heater 56 and pyrometer 74, are magnified while the details of the lower part of the crystal puller shown in FIG. 1 are omitted for clarity. The crystal 31 cools while being pulled upward during growth but the temperature of crystal 31 is preferably maintained above the temperature range at which nucleation of the self-interstitials occurs, such as about 850° C.–950° C., by an upper heater 56 for a time period sufficient for adequate diffusion of intrinsic point defects. Then, after separation from melt, the post growth ingot is rapidly cooled, or quenched, through the nucleation temperature range to inhibit nucleation. Below the nucleation temperature range, no further nucleation will occur. In some manufacturing processes, it is preferred to increase the cooling rate of post growth crystals in order to suppress the nucleation and growth of point defects.

Advantageously, a preferred embodiment of the present invention involves a control system for adjusting the pull rate and/or other post growth processing parameters such as argon gas flow and pressure, upper heater powers, etc. to control the quenching rate of the crystal 31.

Referring further to FIG. 2A, the components of the system 11 for controlling the quenching rate of a crystal according to one preferred embodiment of the invention are shown. As described in more detail in reference to FIG. 4, cable 37 is connected by way of a pulley 41 to the chuck (not shown) that holds the seed crystal 35. The cable 37 is responsive to the motor 53 to pull the crystal 31 upward along the path of the cable toward a receiving chamber, indicated generally at 54, of the crystal pulling apparatus 13. The upper heater 56 keeps crystal 31 at temperature higher than 950° C. as it is being grown. A programmable logic controller (PLC) 69 having a central processing unit (CPU) 71 and a memory 73 is connected to an input device such as a temperature sensor 74 for receiving an input signal. In this embodiment, the memory 73 stores temperature modeling software such as MARC offered by MSC. Software Corporation.

Figure 3:
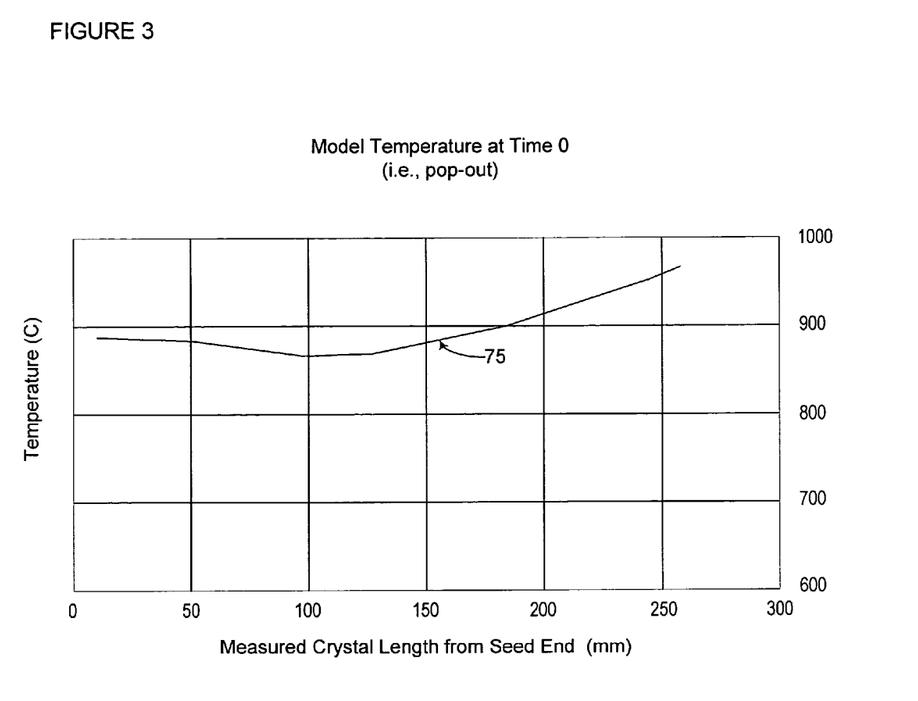
FIG. 3 is an exemplary temperature profile illustrating an estimated temperature along the surface of the crystal prior to quenching.

As known to those skilled in the art, temperature modeling software uses actual hot zone setup parameters as well as heater power and temperature data for critical locations collected during previous crystal runs to simulate a temperature profile representative of the ingot's surface temperature along the length of crystal 31. In this case, the PLC 69 executes temperature modeling software to generate a temperature profile, indicated generally at 75 in FIG. 3, representative of an estimated ingot surface temperature along the length of the crystal 31 at the instant the crystal 31 is pulled from the melt (pop-out), and before the quenching process begins. From the temperature profile, a first temperature $T_1$ at a particular location L along the length of the crystal surface at the instant the crystal 31 is pulled from the melt is determined. A temperature sensor 74 is affixed to the pull chamber of the crystal puller and measures a second temperature T2 at the same particular location L after the crystal 31 has been lifted a distance D along axis 39 in the direction of receiving chamber 54 of crystal growing apparatus 13. In other words, the first temperature $T_1$ corresponds to the temperature of the crystal 31 at the particular location L when the crystal 31 is at a first position P1, and the second temperature $T_2$ corresponds to the temperature of the crystal 31 at the same particular location L when the crystal 31 is at a second position P2.

In one embodiment, the temperature sensor 74 is, for example, an infrared (IR) pyrometer mechanically connected to the receiving chamber of the puller, and is positioned to sense the surface temperature of crystal 31 as it is pulled upward within the puller during and post growth. Those skilled in the art are familiar with pyrometers for continuously capturing temperature measurements. In an alternative embodiment, the temperature sensor 74 is an IR charge coupled device (CCD) camera. If an IR CCD camera is used, the surface temperature of crystal 31 can be captured at certain intervals, typically one reading for every second or every few seconds. In either embodiment, because the temperature sensor 74 is affixed to the pull chamber at a known position along the length of crystal 31, and because the temperature model generates a temperature profile along the length of crystal 31, the distance between location L at pop out and the temperature sensor 74 can be readily determined. For example, if the temperature sensor 74 is positioned such that it is adjacent to the seed end at pop-out, and location L corresponds to a location 250 mm from the seed end along the length of the crystal 31, the distance between the temperature sensor 74 and the particular location L at pop out is 250 mm. In other words, after pop-out the crystal 31 must travel 250 mm upward in order for temperature sensor 74 to sense the temperature at location L along the crystal 31. As explained in more detail below in reference to FIG. 3, PLC 69 is configured to determine when the crystal 31 has traveled a particular distance from input received from the drive unit of the puller, and PLC 69 can also determine the amount of time required to travel the particular distance. By estimating a temperature at a particular location along the length of the crystal 31 at the instant the crystal 31 is pulled from the melt (i.e., before quenching starts) based on melt temperature, and determining the temperature at the same particular position after the crystal 31 is raised a particular distance D, PLC 69 employs the following algorithm to calculate the cooling rate $C_R$:

$$C_R = (T_1 - T_2)/t \qquad (1)$$

where $T_1$ is a first temperature at the particular location L, $T_2$ is a second temperature at the same location L after the ingot (i.e., post growth crystal 31) has been pulled a distance D upward within the puller 13, and t is an amount of time corresponding the time required for the ingot to be pulled the distance D upward within the puller.

In an alternative embodiment, rather than determining the first temperature $T_1$ from a temperature profile, a temperature sensor 76 is positioned, for example, just above the surface of melt 29 to determine the first temperature $T_1$. As shown in FIG. 2B, temperature sensor 76 senses a first temperature $T_1$ at location L along the length of crystal 31 at the instant the crystal 31 is removed from the melt, and temperature sensor 74 senses the second temperature $T_2$ at the same location L after the crystal 31 travels the distance D upward along axis 39 into receiving chamber 54. Moreover, because the sensors 74, 76 are affixed to the crystal pulling chamber, the distance D between two sensors 74, 76 is known and can be stored in memory 73. In such an embodiment, the actual cooling rate is determined as a function of the temperatures sensed by sensors 74, 76, and the time it takes the crystal 31 to travel between the two sensors (i.e., travel distance D). The PLC 69 again employs the algorithm defined by equation 1 to calculate the cooling rate $C_R$ of the crystal 31. However, in this case $T_1$ is the temperature sensed by temperature sensor 76, $T_2$ is the second temperature sensed at the same location L along the length of the crystal 31 by temperature sensor 74 after the crystal has traveled the distance D, which corresponds to the distance between sensors 74, 76, and t is the amount of time taken for the crystal 31 to travel the distance D.

After the actual cooling rate is calculated, PLC 69 compares the calculated cooling rate to a cooling rate stored in memory 73 and generates one or more error signals, or output signals, as a function of the comparison. The target cooling rate can be predetermined from historic processing data relating to when crystal defects, such as slips, occur. For example, CPU 71 can be configured to analyze historical processing data and to identify a maximum cooling rate at which crystal defects such as edge slips did not occur. Alternatively, the target cooling rate can be defined by an operator using a computer linked (e.g., an operating station) to the control system. Those skilled in the art recognize that increasing pull rate decreases the cooling rate over a particular section of the crystal 31 (i.e., takes the crystal a longer time period to cool) as it is lifted a particular distance D, while decreasing the pull rate increases the cooling rate over a particular section of the crystal 31 (i.e., crystal requires a shorter time period to cool) as it is lifted the particular distance D. As can be seen, the target cooling rate can vary depending on the distance D over which the first and second temperatures are observed.

In yet another embodiment, PLC 69 compares the temperature measured by temperature sensor 74 to a target temperature to control the cooling rate of the crystal 31, and generates an error signal or output signal as a function of the comparison. In this case, the target temperature is determined based on the position of temperature sensor 74 along the path of the crystal. In other words, the measured temperature of any particular location along the length of the crystal 31 should not exceed the target temperature when passing the temperature sensor 74. For example, the temperature of the crystal should not be greater than 600° C. when it passes through a location with a high temperature gradient (i.e., quick transition from hot to cold). If the temperature is above the target temperature, one or more processing parameters (e.g., pull rate) are adjusted to increase the cooling rate (i.e., cool the ingot faster).

Output devices such as puller motor 53, heater power supply 82, argon gas supply 84, and/or a vacuum pump (not shown) are connected to PLC 69 and are responsive to the output signals 94, 96, and 98, respectively, to adjust post growth processing parameters for controlling the quenching rate of the crystal 31. For example, in one embodiment, PLC 69 determines a modified or adjusted heater power set point for heating crystal 31 as it is pulled along the path (i.e., axis 39) into the receiving chamber 54 as a function of the error signal, and adjusts the heater power provided to upper heater 56 according to the adjusted heater power set point. In this manner, the invention changes the temperature of the ingot surface to control the cooling rate of crystal 31.

In an alternative embodiment, PLC 69 determines an adjusted flow rate and/or pressure set point for argon gas being introduced into crystal growing apparatus 13 as a function of the error signal. PLC 69 can then adjust the argon gas flow rate and/or pressure to control the cooling rate of the crystal 31. Controlling such parameters as a function of a sensed temperature helps control the concentration of vacancies and self-interstitials to prevent an agglomeration of intrinsic point defects in crystal 31 as it cools from the solidification temperature. It is to be understood that those skilled in the art will recognize that the present invention can be practiced with any suitable PLC. Although it is to be understood that various processing parameters can be controlled using PLC 69 of the invention, for purposes of illustration the invention is described below in connection with controlling pull rate.

Figure 4:
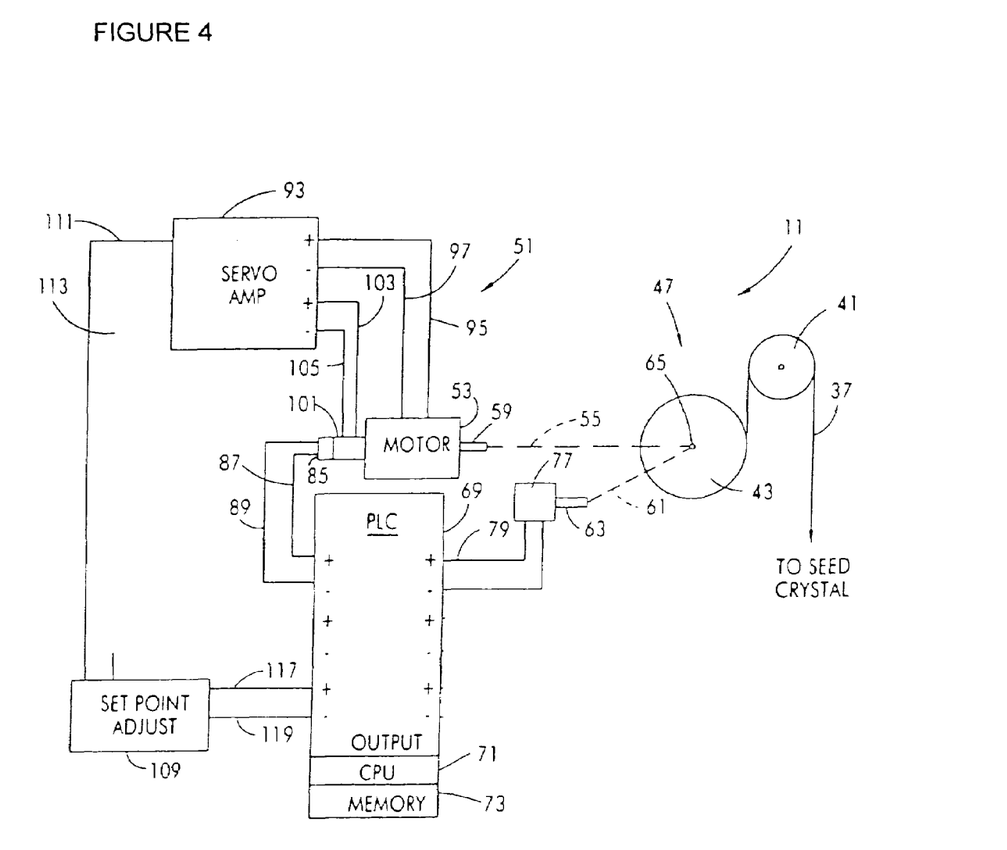
FIG. 4 is a block diagram of the apparatus of FIG. 1 including a control unit having a programmable logic controller (PLC) for controlling pull rate.

FIG. 4 illustrates electrical circuitry embodying control unit 51 for controlling, among other things, crystal drive unit 49, and, thereby control the cooling or quenching rate of the crystal 31. The details of construction of crystal drive unit 49 are well known to those of ordinary skill in the art. Generally, drive unit 49 includes a motor 53 coupled to the drum 43. A dashed line 55 indicates the mechanical coupling between a shaft 59 of the motor 53 and drum 43. Although this mechanical coupling may comprise a direct connection between shaft 59 and drum 43, a preferred arrangement positions a set of reduction gears (not shown) between shaft 59 and drum 43 for better control and smoother operation. Motor 53 is thus operable to let out and reel in cable 37 via drum 43 for lowering seed crystal 35 into melt 29 and for pulling the ingot 31 from melt 29.

A dashed line 61 in FIG. 4 indicates the mounting of drum 43 on a shaft 63 through an opening 65 in drum 43. Commonly assigned U.S. Pat. No. 5,935,328, the entire disclosure of which is incorporated herein by reference, shows a drum and cable arrangement suitable for use with the present invention.

Referring further to FIG. 4, PLC 69 receives an input signal from a 500 pulse per revolution (ppr) encoder 77 via lines 79 and 81. The encoder 77 is coupled to the shaft 63 for producing a position signal. In this instance, the position signal is made up of pulses on lines 79 and 81 that vary as a function of the rotational movement of drum 43. PLC 69 thus counts the pulses on lines 79 and 81 to determine exactly how much drum 43 has rotated during any given period of interest. Encoder 77 is preferably operated in a 2X mode wherein the encoder emits 1000 discrete pulses for each 360 degree rotation of drum 43. Accordingly, if PLC 69 counts 5,500 pulses on lines 79 and 81, then it is known that drum 43 rotated exactly five and one half revolutions during the period when the pulses were generated. Alternatively, a gearing mechanism (not shown) drives drum 43 and encoder 77 can be coupled to one of the rotating gears in the gearing mechanism. Given that the gear ratios are readily known, the number of rotations of drum 43 can be calculated in a manner similar to that disclosed above.

In the illustrated embodiment, PLC 69 is also connected to a 60 ppr encoder 85 via lines 87 and 89. Encoder 85 is coupled to the shaft 59 of motor 53 and produces pulses on lines 87 and 89 as a function of the rotational movement of the shaft. The PLC 69 thus counts the pulses on lines 87 and 89 to determine exactly how much shaft 59 has rotated during any given period of interest. Encoder 85 is preferably operated in a 4X mode wherein the encoder emits 240 pulses for each 360° rotation of the shaft. Accordingly, if PLC 69 counts 480 pulses on lines 87 and 89, then it is known that the shaft 59 of motor 53 rotated exactly two complete revolutions during the period when the pulses were generated.

The PLC 69 is also programmed via conventional means with the size of drum 43 and with the gear ratios which connect shaft 59 of motor 53 to shaft 63 which turns drum 43. Given that the number of rotations of shaft 59 is known from the number of pulses on lines 87 and 89, given that the gear ratio coupling shaft 59 to drum 43 is known, and given that the diameter of drum 43 is known, PLC 69 is readily programmed via conventional means to convert the number of pulses received from encoder 85 into a numeric figure representing the linear movement of cable 37 in real time. In other words, by counting the pulses on lines 87 and 89, PLC 69 readily calculates the pull velocity of cable 37, and, thus, can calculate the time t required for the cable to travel a distance D.

A servo amplifier 93 is connected to the motor 53 via lines 95 and 97 and to a tachometer 101 via lines 103 and 105 in a conventional closed loop feedback arrangement. The tachometer 101 produces an analog signal on lines 103 and 105, which varies in voltage as a function of the rotational speed of the shaft 59 of motor 53. The servo amplifier 93 receives the analog voltage signal on lines 103 and 105. Servo amplifier 93 also receives a set point signal from a set point adjusting circuit 109 via lines 111 and 113. For example, the set point adjusting circuit 109 adjust pull rate in response to the calculated quenching rate, as described above. As a result, PLC 69 controls set point adjusting circuit 109 and, hence, the set point signal via lines 117 and 119, and, thus, PLC 69 controls the speed of motor 53.

More particularly, servo amplifier 93 responds to the set point signal on lines 111 and 113 by producing a current signal, which is supplied to motor 53 via lines 95 and 97. The current signal energizes the motor and determines its speed. Servo amplifier 93 then uses the analog voltage signal received from tachometer 101 to determine whether motor 53 is operating at the speed which corresponds to the set point signal. If not, servo amplifier 93 adjusts the current signal up or down, as the case may be, until the analog voltage signal from tachometer 101 indicates that motor 53 is operating at the speed set by the set point signal. Again, since PLC 69 controls the set point signal via lines 117 and 119, PLC 69 controls the speed of motor 53.

In an open loop arrangement, temperature readings from the one or more sensors are collected and the quenching rates of the crystal are calculated after crystal growth and post growth quenching. Thereafter, one or more post growth process parameters are modified and programmed for use during subsequent crystal growth and post growth quenching to achieve optimized quenching rate and crystal quality.

Figure 5:
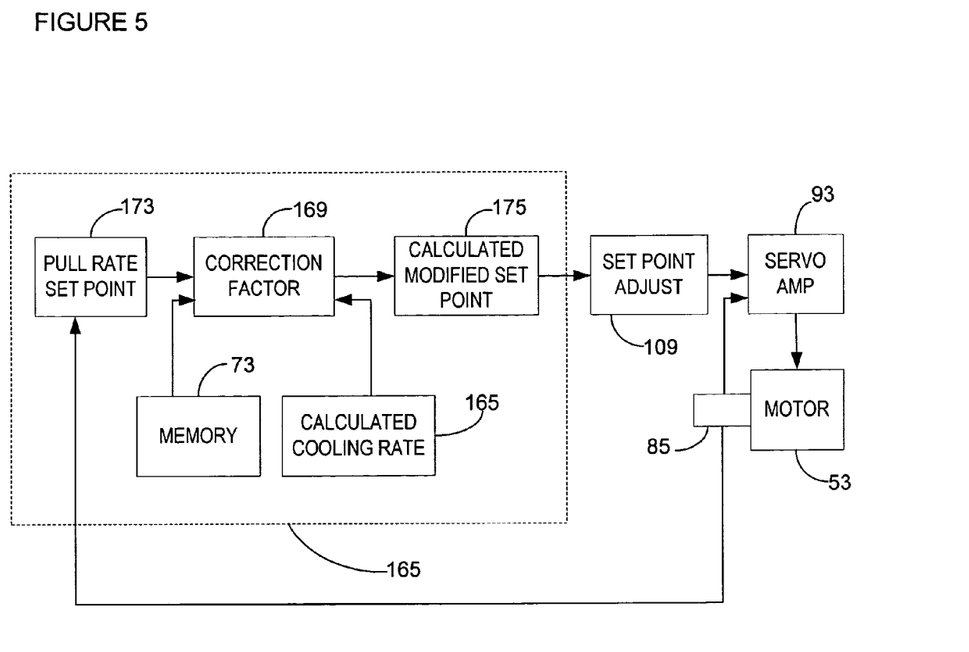
FIG. 5 is a block diagram of the apparatus of FIG. 1 operating to calculate a modified set point.

FIG. 5 is a block diagram showing how PLC 69, once the cooling rate has been calculated, controls the pull rate of a crystal 31 post growth. Preferably, PLC 69 performs the finctions within a dashed line 165. More particularly, PLC 69 compares the calculated cooling rate 165 to what is expected to occur, that is, the target cooling rate stored in memory 73. PLC 69 then uses the difference between the expected results and the actual results to calculate a correction factor 169. PLC 69 determines a pull rate set point 102 from, for example, the output of encoder 85. By multiplying the correction factor 169 times the set point 173, PLC 69 thus calculates a modified set point 175. PLC 69 outputs the modified set point 175 to the set point adjusting circuitry 109 to control motor 53 and, thus, the rate at which the crystal 31 is pulled. Adjusting the set point in this manner keeps the cooling rate is kept close to the target cooling rate throughout the quenching process. In other embodiments, the PLC 69 is configured to adjust the set point of heater power and/or the set point of argon pressure and flow rate.

Figure 6A:
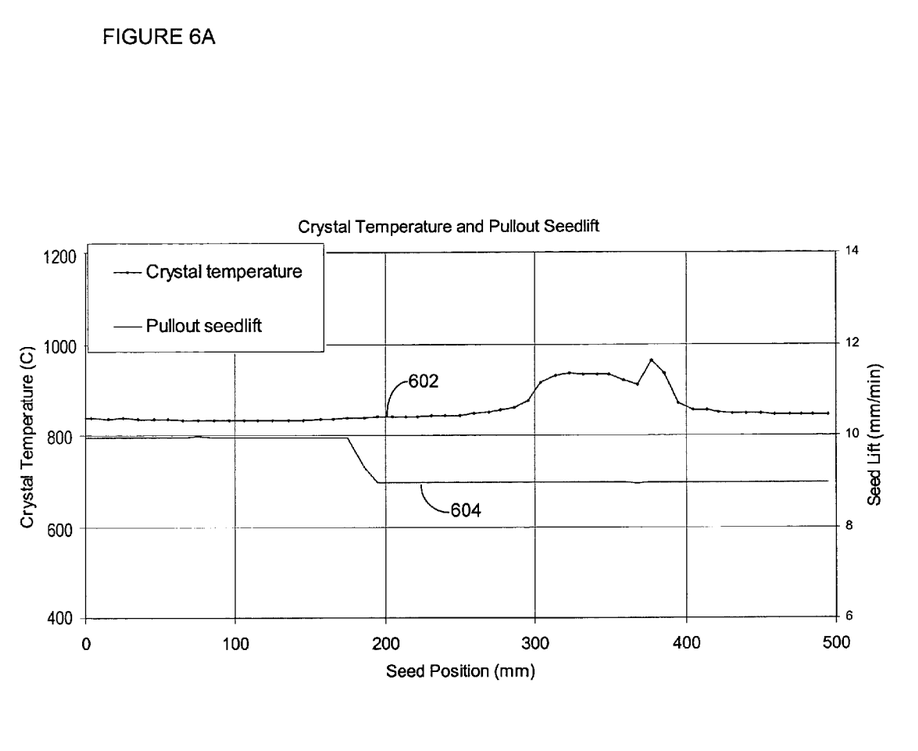
FIG. 6A shows an exemplary temperature curve and an exemplary pull rate curve for a crystal ingot for which the quenching rate is not optimized according to the invention.
Figure 6B:
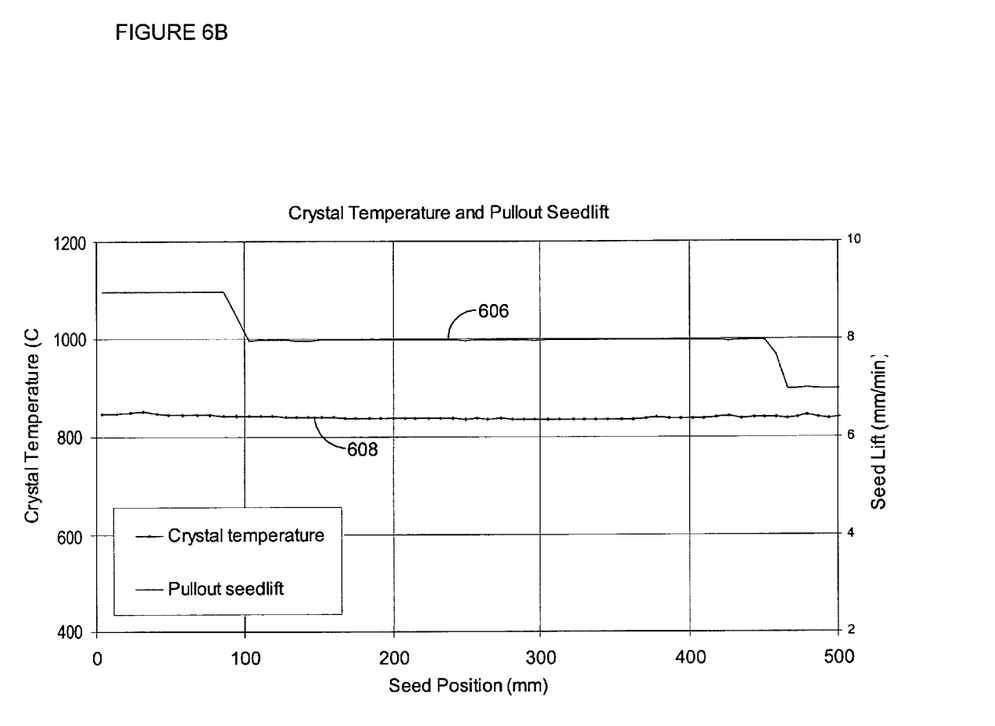
FIG. 6B shows an exemplary temperature curve and an exemplary pull rate curve for a crystal ingot for which the quenching rate is optimized according to the invention.

Referring now to FIG. 6A, which illustrates the pull out rate, indicated generally at 602, and resulting crystal temperature, indicated generally at 604, when quenching is not optimized. More specifically, FIG. 6A illustrates how the temperatures sensor observes higher than desired surface temperatures when the crystal 31 is raised too fast (e.g., see seed position 280 mm–400 mm). In contrast FIG. 6B illustrates the pull out rate, indicated generally at 606, and resulting crystal temperature, indicated generally at 608, when quenching is optimized. In particular, FIG. 5B shows that modifying the pull rate (e.g., decreasing pull rate) eliminates the higher than desired temperatures.

Figure 7:
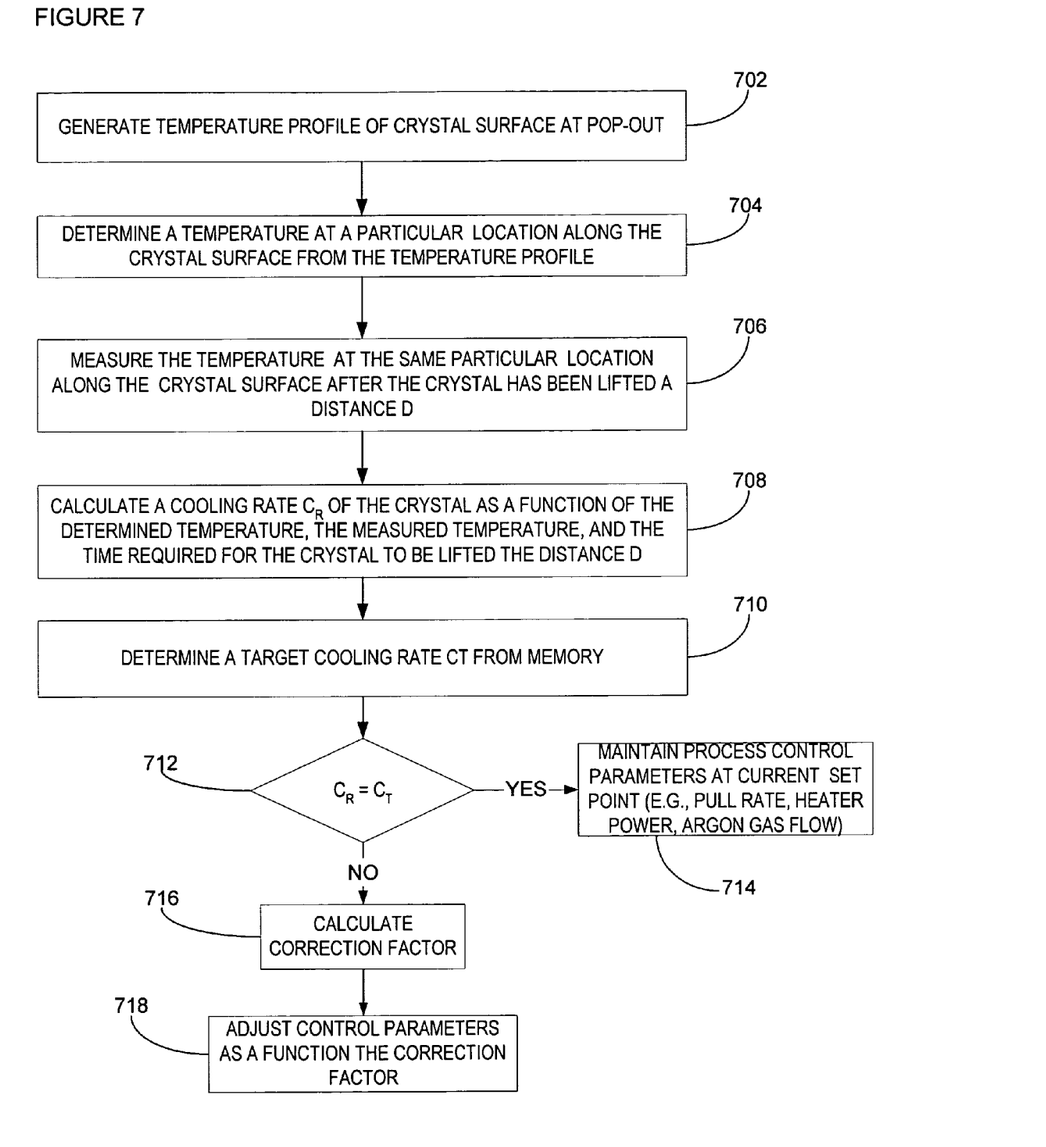
FIG. 7 is a flow diagram illustrating the operation of the PLC of FIG. 4 for controlling the quenching rate.

Referring now to FIG. 7, an exemplary flow chart illustrates a method of maximizing the quenching rate of silicon ingot crystal according to one embodiment of the invention. At 702, the PLC generates a temperature profile representative of the estimated surface temperature along the length of the crystal at the instant the crystal 31 is pulled from silicon melt 29 from which it is grown. The temperature at a particular location along the length of crystal 31 is determined from the temperature at 704. At 706, the temperature at the same particular location along the length of the crystal is measured with a temperature sensor (e.g., sensor 74) after the crystal is raised a particular distance D. The PLC 69 calculates a cooling rate for crystal 31 as a function of the temperature determined from the temperature profile, the temperature measured by temperature sensor 74, and the time taken for the crystal to be raised the particular distance D at 708. At 710, a target cooling rate is retrieved from memory 73. At 712, the calculated cooling rate is compared to a target cooling rate. If the calculated cooling rate is equal to the target cooling rate at 712, PLC 69 maintains pull rate at the current set point at 714. If the calculated cooling rate is less than or greater than the target cooling rate at 712, the PLC 69 generates a correction factor at 716. At 718, PLC 69 adjusts the processing parameters as a function of the correction factor. For example, if the calculated cooling rate is less than the target cooling rate, the PLC 69 adjusts the pull rate as a function of the correction factor such that the pull rate decreased. As another example, if the calculated cooling rate is greater than target cooling rate, PLC 69 adjusts the pull rate as a function of the correction factor such that the pull rate increased.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method for use with a crystal growing apparatus for optimizing a cooling rate of a monocrystalline ingot grown according to a Czochralski process, said crystal growing apparatus having a heated crucible containing a semiconductor melt from which the ingot is grown, said ingot being grown on a seed crystal pulled from the melt, said crystal growing apparatus further having a receiving chamber into which the ingot is pulled, said ingot being pulled along a generally longitudinal path toward the receiving chamber, said method comprising:
   determining a first temperature of the ingot when the ingot is at a first position along the path;
   determining a second temperature of the ingot when the ingot is at a second position along the path, said first and second positions being separated by a distance D along the path;
   determining a cooling rate of the ingot as a function of a difference between the first temperature and the second temperature relative to an amount of time for pulling the ingot the distance D;
   generating a signal representative of an error between a target cooling rate of the ingot and the determined cooling rate of the ingot; and
   adjusting one or more post-growth processing parameters as a function of the error signal thereby to control the cooling rate of the ingot.

2. The method of claim 1, wherein determining the first temperature includes measuring the first temperature of the ingot at a location along the length of the ingot when the ingot is at the first position and determining the second temperature includes measuring the second temperature of the ingot at the same location along the length of the ingot when the ingot is at the second position.

3. The method of claim 1 further comprising defining the target cooling rate from historical processing data stored in a memory.

4. The method of claim 1 further comprising defining a temperature model representative of an estimated temperature profile along the length of the ingot based on a sensed temperature when the ingot is initially pulled from the melt, and wherein determining the first temperature includes estimating the first temperature of the ingot at the location along the length of the ingot when the ingot is at the first position along the path from the temperature model, and wherein determining the second temperature includes measuring the second temperature of the ingot surface at the same location along the length of the ingot when the ingot is at the second position after the ingot is pulled the distance D along the path toward the receiving chamber.

5. The method of claim 1, wherein determining the cooling rate includes calculating a cooling rate $C_R$ by the following:

$$C_R = (T_1 - T_2)/t$$

where $T_1$ is the first temperature, $T_2$ is the second temperature, and t is the amount of time required for the ingot to be pulled the distance D.

6. The method of claim 1, wherein the ingot is pulled along the path toward the receiving chamber at a pull rate, and wherein adjusting the post growth processing parameter includes:
   determining a pull rate set point as a function of the error signal; and
   adjusting the pull rate according to the pull rate set point to control to cooling rate of the ingot.

7. The method of claim 1, wherein the crystal growing apparatus has a heater positioned above the melt for heating the ingot as it is pulled along the path into the receiving chamber, and wherein adjusting the post growth processing parameter includes:
   determining a heater power set point as a function of the error signal; and
   adjusting power supplied to the heater according to the heater power set point to control the cooling rate of the ingot.

8. The method of claim 1, wherein adjusting the post growth processing parameter includes adjusting at least one of the following to control the cooling rate of the ingot; an argon gas flow rate; furnace pressure; heater power; and pull rate.

9. A method for use with a crystal growing apparatus for optimizing a cooling rate of a monocrystalline ingot grown according to a Czochralski process, said crystal growing apparatus having a heated crucible containing a semiconductor melt from which the ingot is grown, said ingot being grown on a seed crystal pulled from the melt, said crystal growing apparatus further having a receiving chamber into which the ingot is pulled, said ingot being pulled along a generally longitudinal path toward the receiving chamber, said method comprising:
   measuring a temperature of the ingot at a location along the length of the ingot at a position along the path;
   generating a signal representative of an error between a target temperature of the ingot when it is at the position along the path and the measured temperature of the ingot; and
   adjusting one or more post growth processing parameters as a function of the error signal thereby to control to cooling rate of the ingot.

10. The method of claim 9 further comprising defining the target temperature from historical processing data stored in a memory, and wherein the target temperature is dependent on the position along the path at which temperature is being measured.

11. The method of claim 9, wherein adjusting the post growth processing parameter includes adjusting at least one of the following to control the cooling rate of the ingot; an argon gas flow rate; furnace pressure; heater power; and pull rate.

12. An apparatus for use with a crystal growing apparatus for optimizing a cooling rate of a monocrystalline ingot grown according to a Czochralski process, said crystal growing apparatus having a heated crucible containing a semiconductor melt from which the ingot is grown, said ingot being grown on a seed crystal pulled from the melt, said crystal growing apparatus further having a receiving chamber into which the ingot is pulled, said ingot being pulled along a generally longitudinal path toward the receiving chamber, said method comprising:
   a first temperature sensor positioned along the path of the ingot for measuring a first temperature of the ingot surface at a location along the length of the ingot when the ingot is at a first position along the path;
   a second temperature sensor positioned along the path of the ingot for measuring a second temperature of the ingot surface at the same location along the length of the ingot when the ingot is at a second position along the path, said first and second positions being separated by a distance D;

a controller for generating an error signal representative of an error between a target cooling rate of the ingot and a calculated cooling rate of the ingot, said calculated cooling rate being calculated as a function of a difference between the first temperature and the second temperature relative to an amount of time for pulling the ingot the distance D; and a processing component responsive to the error signal for adjusting a processing parameter set point as a function of the error signal to control the cooling rate of the ingot.

13. The apparatus of claim 12, wherein the processing component generates a pull rate set point as a function of the error signal, and wherein a puller motor is responsive to the pull rate set point generated by the processing component to adjust the pull rate of the ingot thereby controlling the cooling rate of the ingot.

14. The apparatus of claim 12, wherein the crystal growing apparatus has a heater positioned above the melt for heating the ingot as it is pulled along the path into the receiving chamber, and wherein the processing component generates a heater power set point for the power supplied to the heater as a function of the error signal, and wherein a power supply is responsive to the heater power set point generated by the processing component for adjusting the power supplied to the heater thereby controlling the cooling rate of the ingot.

15. The apparatus of claim 12, wherein the processing component generates a flow rate set point for an argon gas being introduced into the crystal growing apparatus as a function of the error signal, and wherein an argon flow component is responsive to the flow rate set point generated by the processing component to adjust the flow rate of the argon gas thereby controlling the cooling rate of the ingot.

16. The apparatus of claim 12, wherein the temperature sensor is configured to sense a temperature of an ingot surface, and generates a temperature signal representative of the sensed temperature.

17. The apparatus of claim 12 further including a central processing unit for processing historical processing data to identify the target cooling rate and a memory for storing the target cooling rate.

18. The apparatus of claim 12, wherein an operator uses a computer linked to a memory to define the target cooling rate.

19. An apparatus for use with a crystal growing apparatus for optimizing a cooling rate of a monocrystalline ingot grown according to a Czochralski process, said crystal growing apparatus having a heated crucible containing a semiconductor melt from which the ingot is grown, said ingot being grown on a seed crystal pulled from the melt, said crystal growing apparatus further having a receiving chamber into which the ingot is pulled, said ingot being pulled along a generally longitudinal path toward the receiving chamber, said method comprising:

a temperature sensor positioned along the path of the ingot for measuring a temperature of the ingot surface at a location along the length of the ingot when the ingot is at a position along the path;

a controller for generating an error signal representative of an error between a target temperature of the ingot when it is at the position along the path and the measured temperature of the ingot; and a processing component responsive to error signal for adjusting a processing parameter set point as a function of the error signal to control the cooling rate of the ingot.

20. The apparatus of claim 19, wherein the target temperature is defined from historical processing data stored in a memory, and wherein the target temperature is dependent on the position along the path at which temperature is being measured.

21. The apparatus of claim 19, wherein the processing component generates a pull rate set point as a function of the error signal, and wherein a puller motor is responsive to the pull rate set point generated by the processing component to adjust the pull rate of the ingot thereby controlling the cooling rate of the ingot.

22. The apparatus of claim 19, wherein the crystal growing apparatus has a heater positioned above the melt for heating the ingot as it is pulled along the path into the receiving chamber, and wherein the processing component generates a heater power set point for the power supplied to the heater as a function of the error signal, and wherein a power supply is responsive to the heater power set point generated by the processing component for adjusting the power supplied to the heater thereby controlling the cooling rate of the ingot.

23. The apparatus of claim 19, wherein the processing component generates a flow rate set point for an argon gas being introduced into the crystal growing apparatus as a function of the error signal, and wherein an argon flow component is responsive to the flow rate set point generated by the processing component to adjust the flow rate of the argon gas thereby controlling the cooling rate of the ingot.

* * * * *

UNITED STATES PATENT AND TRADEMARK OFFICE
CERTIFICATE OF CORRECTION

PATENT NO. : 6,960,254 B2 Page 1 of 1
APPLICATION NO. : 10/623967
DATED : November 1, 2005
INVENTOR(S) : Zheng Lu and Steven L. Kimbel It is certified that error appears in the above-identified patent and that said Letters Patent is hereby corrected as shown below:

<u>Column 14</u>
Claim 6, line 4, "to control to cooling" should read -- to control the cooling --.
Claim 8, line 18 "the ingot; and" should read -- the ingot: an --.
Claim 9, line 38, "to control to cooling" should read -- to control the cooling --.

Signed and Sealed this

Twenty-eighth Day of August, 2007

JON W. DUDAS
*Director of the United States Patent and Trademark Office*